(12) United States Patent
Salvador et al.

(10) Patent No.: US 9,705,062 B2
(45) Date of Patent: Jul. 11, 2017

(54) ENCAPSULATION OF HIGH TEMPERATURE THERMOELECTRIC MODULES

(71) Applicant: GM GLOBAL TECHNOLOGY OPERATIONS LLC, Detroit, MI (US)

(72) Inventors: James R. Salvador, Royal Oak, MI (US); Jeffrey Sakamoto, East Lansing, MI (US); Youngsam Park, East Lansing, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 339 days.

(21) Appl. No.: 14/468,373

(22) Filed: Aug. 26, 2014

(65) Prior Publication Data
US 2016/0064638 A1 Mar. 3, 2016

(51) Int. Cl.
*H01L 35/34* (2006.01)
*H01L 35/32* (2006.01)

(52) U.S. Cl.
CPC ............ *H01L 35/325* (2013.01); *H01L 35/32* (2013.01); *H01L 35/34* (2013.01)

(58) Field of Classification Search
CPC ......... H01L 35/02; H01L 35/04; H01L 35/32; H01L 35/34; H01L 35/325
See application file for complete search history.

(56) References Cited

U.S. PATENT DOCUMENTS

| 4,211,889 A | 7/1980 | Kortier et al. | |
| 2008/0137309 A1* | 6/2008 | Barry | H01L 23/3121 361/720 |
| 2014/0026619 A1* | 1/2014 | Maloney | C03B 23/245 65/43 |
| 2015/0155413 A1* | 6/2015 | Ghoshal | H01L 35/04 136/206 |

OTHER PUBLICATIONS

Mitsuru Kambe et al; Encapsulated Thermoelectric Modules and Compliant Pads for Advanced Thermoelectric Systems; Journal of Electronic Materials, vol. 39, No. 9, 2010; DOI: 10.1007/s11664-010-1315-0; pp. 1418-1421.

* cited by examiner

*Primary Examiner* — Susan D Leong
(74) *Attorney, Agent, or Firm* — Reising Ethington P.C.

(57) ABSTRACT

A method of encapsulating a thermoelectric device and its associated thermoelectric elements in an inert atmosphere and a thermoelectric device fabricated by such method are described. These thermoelectric devices may be intended for use under conditions which would otherwise promote oxidation of the thermoelectric elements. The capsule is formed by securing a suitably-sized thin-walled strip of oxidation-resistant metal to the ceramic substrates which support the thermoelectric elements. The thin-walled metal strip is positioned to enclose the edges of the thermoelectric device and is secured to the substrates using gap-filling materials. The strip, substrates and gap-filling materials cooperatively encapsulate the thermoelectric elements and exclude oxygen and water vapor from atmospheric air so that the elements may be maintained in an inert, non-oxidizing environment.

20 Claims, 8 Drawing Sheets

ENCAPSULATION OF HIGH TEMPERATURE THERMOELECTRIC MODULES

This invention was made with U.S. Government support under Agreement No. DE-EE0005432 awarded by the Department of Energy. The U.S. Government may have certain rights in this invention.

TECHNICAL FIELD

This invention pertains to methods of encapsulating thermoelectric devices intended for use at temperatures of 400° C. to 600° C. in oxygen-containing atmospheres to protect against in-service, high temperature oxidation of the thermoelectric elements in the devices.

BACKGROUND OF THE INVENTION

Continuing pressure for improving the fuel consumption of automobiles and light trucks has raised interest in extracting energy from the heat contained in the exhaust gas that is normally lost when the exhaust gas is vented to the atmosphere. One approach under consideration is to use thermoelectric elements which generate an electrical potential difference when a temperature gradient is established and maintained so that one end of the thermoelectric element is maintained at a higher temperature than the other end. For an individual element, both the potential difference and the current conveyed from the element under such a temperature gradient may be small, but a thermoelectric device fabricated from a plurality of such elements is capable of generating sufficient power to supplement other on-vehicle electrical resources.

A wide range of materials exhibit the thermoelectric effect, but, semiconductor compositions such as PbTe and SiGe are gaining in prominence. For high temperature use, SiGe and Zintl phase compositions such as $Yb_{14}MnSb_{11}$ may offer some advantage as may skutterudite compositions based on compounds with the general formula $MX_3$ where M may be Co, Ni, or Fe and X may be P, Sb, or As, for example $CoP_3$ and $CoAs_3$. Further examples of semiconductor binary skutterudites, here incorporating platinum group metals, include $RhP_3$, $RhAs_3$, $RhSb_3$, $IrP_3$, $IrAs_3$, and $IrSb_3$.

A suitable elevated temperature skutterudite composition is based on $CoSb_3$, sometimes written as $Co_4Sb_{12}$, which may be doped with one or more dopants of rare-earth, alkaline-earth, or alkali metal elements to render an n-type element. Substitution of Fe or a suitable combination of Fe and Ni for Co, in conjunction with the above-mentioned dopants, results in a p-type element. Alternating p-type and n-type elements may then be arranged into a thermoelectric device. This $CoSb_3$ skutterudite composition is well adapted to extract energy from automotive exhaust gases at temperatures of 400° C. to 600° C.

One end of the elements or the one side of the device may be placed, either in good thermal contact with the exhaust gas stream directly or with the exhaust pipe conveying the exhaust gas to the rear of the vehicle for discharge. The other end of the element or opposing side of the device is thermally coupled to a suitable heat sink to establish the temperature difference across the elements. Commonly the 'cold' side of the device may be thermally coupled to atmospheric air or to engine coolant to maintain the cold side at a more or less constant temperature to enable such a temperature difference during all phases of engine operation.

At least a portion of an unsealed thermoelectric device, when used to extract energy from a vehicle exhaust, may be exposed to appreciable temperatures of 500° C. or more in an oxidizing environment. Under these operating conditions the thermoelectric composition may degrade. For example, $CoSb_3$, which does not form a protective oxide, will both progressively oxidize and sublime when exposed to these conditions. Thus, for durability and longevity, the device may be encapsulated or otherwise isolated from exposure to at least air, oxygen, and water vapor when in service at elevated temperatures such as those representative of exhaust gas temperatures. However such encapsulation/isolation should not compromise the intended purpose of the device, that is, to exploit to the temperature difference between the heated exhaust and the environment by generating electricity. Thus the protective structure should neither interpose a significant thermal barrier between the device and the heat source or heat sink, nor provide a shunt, or an alternative pathway for heat flow, which allows an appreciable portion of the heat flow to bypass the device.

SUMMARY OF THE INVENTION

Many automotive vehicles have a gasoline-fueled or diesel-fueled engine in the front of the vehicle with a combustion gas exhaust conduit that connects to the exhaust manifold of the engine and leads under the vehicle to the rear where the exhaust is discharged. This exhaust passage comprises sections of high temperature resistant, alloy steel pipes that typically carry the hot engine exhaust to and from a catalyzed exhaust gas treatment container, an exhaust resonator and a muffler. The steel exhaust pipes are usually round with an internal diameter of about 70 mm to about 100 mm. The temperature of the exhaust gas exiting the exhaust manifold at any time is a function of how long the engine has been running and how much fuel it is consuming, and may range from 400° C. to 600° C. or even higher, depending on its position in the exhaust stream. Oxidation reactions in a catalytic converter may increase exhaust temperatures downstream of the converter.

At least some of the waste heat discharged with the exhaust gases may be recovered, as electricity, by a thermoelectric device.

Such thermoelectric devices comprise a plurality of spaced apart, closely spaced, thermoelectric elements placed in a patterned array and sandwiched between opposing, electrically non-conductive, but thermally-conductive sheet substrates. Frequently these substrates are ceramic. Preferred compositions include $Al_2O_3$ and AlN, with AlN being preferred where higher thermal conductivity is required. Each substrate has an element-contacting surface internal to the device and heat source-contacting or heat sink-contacting surface on the device exterior.

Commonly such devices are relatively thin, say 5-8 millimeters thick, and extensive, with lateral dimensions commonly ranging up to about 40 millimeters by 40 millimeters, and even greater in some specialty applications. Each device typically comprises a patterned array of equal numbers of closely-spaced but non-contacting, alternating polar n-type and p-type semiconductor elements of like dimension and complementary cross-section. These alternating p-type and n-type polar semiconductor elements may be electrically connected in series or series/parallel configurations with element-to-element interconnects that terminate in two, externally-accessible, terminals which are connected to the first and last elements in the patterned array. The electrical interconnects may be independent of the substrates, or, preferably, the interconnects may be patterned conductive metal, typically copper or aluminum, deposited on, and integral with, the substrate(s). Where substrates patterned with conductive metal are employed, patterning may be applied to both sides of the substrate to balance forces resulting from any mis-match in the coefficient of thermal expansion of the pattern and the ceramic substrate. Electrical and structural attachment of the thermoelectric elements to the interconnects is by brazing or soldering using a high temperature solder.

In operation, one of the substrates is positioned in thermal contact with a heat source and the other substrate is maintained in thermal contact with a heat sink so that a temperature gradient is established through the thickness of the device. This results in generation of an electric current at an electrical potential which may be accessed through the two externally-accessible terminals.

In principle a thermoelectric device may be operated with either of the substrates in contact with the heat source, that is, there is no physical basis for designating one substrate as a high temperature-side substrate, or high temperature substrate, and the other as a low temperature-side, or low temperature, substrate. In practical thermoelectric devices however, the substrate on which the external connectors are mounted or supported, is commonly employed as the low temperature-side or low temperature substrate. Thus practical devices are fabricated in a manner which differentiates the opposing substrates and directs one substrate to elevated temperature exposure and the opposing substrate for lower temperature exposure.

When employed on a vehicle exhaust, the thermoelectric device may be positioned with the hot or high temperature-side substrate in thermal communication with the exhaust gases directly or with the exhaust pipe, possibly mediated using a heat exchanger. The other substrate, the cold or low temperature-side substrate, may be positioned to thermally communicate with atmospheric air or some other cooling fluid, such as engine coolant. Possibly, thermal communication at the cold substrate may be improved by application of thermally conductive pastes such as Omegatherm OT-201 Thermally Conductive Silicone Paste (Omega Engineering, Inc., Stamford, Conn.) and AOS Non-Silicone XT-3 Heat Sink Compound (AOS Thermal Compounds, Eatontown, N.J.).

Generally, such thermoelectric devices, irrespective of the specific configuration, will operate in, and be exposed to, atmospheric air. Thus, if unsealed, oxidation of the elements may occur, particularly in units operated at temperatures appreciably greater than ambient temperature. If the thermoelectric elements do not develop protective oxide films, such oxidation may proceed until the element is fully oxidized and the thermoelectric device rendered inoperable.

It is an intent of this invention to limit or prevent access of oxidizing gases such as oxygen or water vapor to the device to preferably eliminate, or, at least limit, oxidation of the thermoelectric elements and/or the electrical interconnects, especially at the high temperature end of the elements where the oxidation reaction is expected to proceed most rapidly. It is a further intent of this invention to achieve such restriction of oxidizing gas to the thermoelectric elements or interconnects with minimal prejudice to the performance of the thermoelectric device. It is a particular intent of the invention to limit any reduction in temperature of the hot end of the elements and/or limit any increase in temperature of the cold end of the elements in service. Such reduction may occur through introducing additional thermal resistance into the heat flow path through the substrate or by introduction of an alternate or 'shunt' heat flow path which bypasses the substrate(s) and thermoelectric elements.

The ceramic substrates located on the outer surfaces of the sandwich construction typical of thermoelectric devices are impervious to atmospheric air, but the perimeter of the device may be unsealed, permitting ingress of oxygen or water vapor. As described further below, air is excluded from the perimeter of the thermoelectric device by a thin-wall, oxidation-resistant, metal shield consisting of a continuous, thin metal strip extending around the periphery of the device and extending from the external surface of one substrate almost to the electrode-contacting surface of the second substrate to substantially cover the edge of the device. The edges of the thin-walled strip are each secured to the electrically non-conductive substrates. The high temperature-side substrate is secured to the metal strip using vitreous ceramic enamel formed in place by reaction and flow of several, intimately-mixed, finely-ground, ceramic powders or by partially reflowing pre-vitrified crushed enamel particles. The low temperature-side substrate is secured to the metal strip using a filled or unfilled, electrically non-conductive polymer such as epoxy, RTV silicone or a thermoplastic. The thin-walled metal strip may be resistant to oxidation at least under temperatures of up to 600° C. or so.

To reduce 'shunt' thermal losses arising from the diversion of heat flow through the device to heat flow through the shield, the material forming the strip should be thin and have low thermal conductivity. Suitable materials include austenitic stainless steel, for example 300 series compositions such as SS304 and SS316, as well as ferritic, 400 series compositions, such as SS430, as well as commercial purity titanium, all of which are available as rolled foils. Suitably the metal strip will range in thickness from about 10 to 100 micrometers.

The thin-walled strip may be fabricated from a flat-rolled foil strip by folding the strip back on itself and joining the ends of the strip to one another. This may be done while forming or shaping the strip over a mandrel to develop a desired plan view or opening geometry. Suitably the joining process should seal the joint area so that the resulting thin-walled strip is impermeable to oxygen along its entire length, including the joint. Suitable joining methods may include brazing, or ultrasonic or laser welding.

The shield may be formed with vertical walls or with outwardly-extending inclined walls or with outwardly-extending bowed walls, each of the vertical or inclined walls optionally incorporating one or more steps or changes in slope. Irrespective of the details of the wall geometry, the vertical height of the walls should be less than the sum of the thickness of the high temperature substrate, the thickness of the interconnects, and the height or thickness of the thermoelectric element. This ensures that a gap is created between the bottom of the shield wall and the element-contacting surface of the low temperature substrate. This gap ensures that the electrically conductive shield does not contact and electrically short out the external electrical connections to the thermoelectric device, which may be supported and exposed on the element-contacting surface of the low temperature-side substrate. Preferably the vertical height of the walls should be between 90 and 95% of the high temperature-side substrate thickness and element thickness.

The structural integrity of the thermoelectric device is determined by the cooperative effect of the thermoelectric elements and their attachment to the high and low temperature substrates as noted above. Thus the foil shield need play no structural role, and the structural characteristics of the foil need not inform the choice of a suitable foil material or a suitable foil thickness. Factors which do inform the choice of a suitable foil thickness include the oxidation performance of the chosen shield material, its ability to maintain a preset geometry, and its low thermal conductance which reduces thermal shunting. The ability of the thin-walled strip to maintain a predetermined geometry may facilitate handling and assembly. In addition, it may also enable the introduction of features to facilitate placement and/or attachment of the foil and the substrate as well as features for accommodating thermal expansion of the device in service.

The vitreous enamel formulation used to secure the shield to the high temperature substrate should have a number of desirable characteristics including, a coefficient of thermal expansion comparable to that of stainless steel (which ranges between about $10$-$17 \times 10^{-6}$/deg. C.) and a lower melting point than skutterudites. The enamel should not react with skutterudites and should be impermeable to oxygen. In addition, the enamel may be provided as an enamel precursor comprising mixed ceramic powders which, upon heating will melt to form the vitreous enamel, or as a crushed, pre-vitrified enamel suitably size-sorted to render an enamel powder. A suitable exemplary enamel is Thomson Enamel '6000 clear', available as sized, pre-vitrified powder from Thomson Enamel, PO Box 310, Newport, Ky. 41072. This enamel comprises, in major proportions by weight, silicon, sodium, and oxygen and lesser quantities of other elements.

Bonding of the enamel to stainless steel may be promoted by coating the stainless steel with copper, or by roughening the stainless steel surface, or by developing a thicker-than-normal oxide coating on the stainless steel surface by briefly heating it in air. In practices of this invention the thin-walled shield may be attached to the high temperature substrate before, or after, the thermoelectric elements are secured to the substrate. The choice of the braze alloy used to secure the thermoelectric elements to the substrates should thus be informed by the melting point of the braze alloy relative to the melting point or flow temperature of the enamel since it is important to assure that the thermal processing for brazing does not undo the effects of prior enameling, or that the thermal processing for enameling does not undo the effects of prior processing for brazing.

The fluidity of the vitreous enamel may be adjusted by control of temperature. Exemplary enamel Thomson Enamel '6000 clear' may not flow appreciably at a temperature of 600° C., may flow readily at 700° C. and may exhibit limited flow at 650° C. during typical processing times of about 1 hour at temperature. Permissible brazing temperatures may depend on whether or not the vitreous enamel was applied prior to, or subsequent to, brazing and the specific solidus and liquidus temperatures of the braze alloy.

Figure 1:
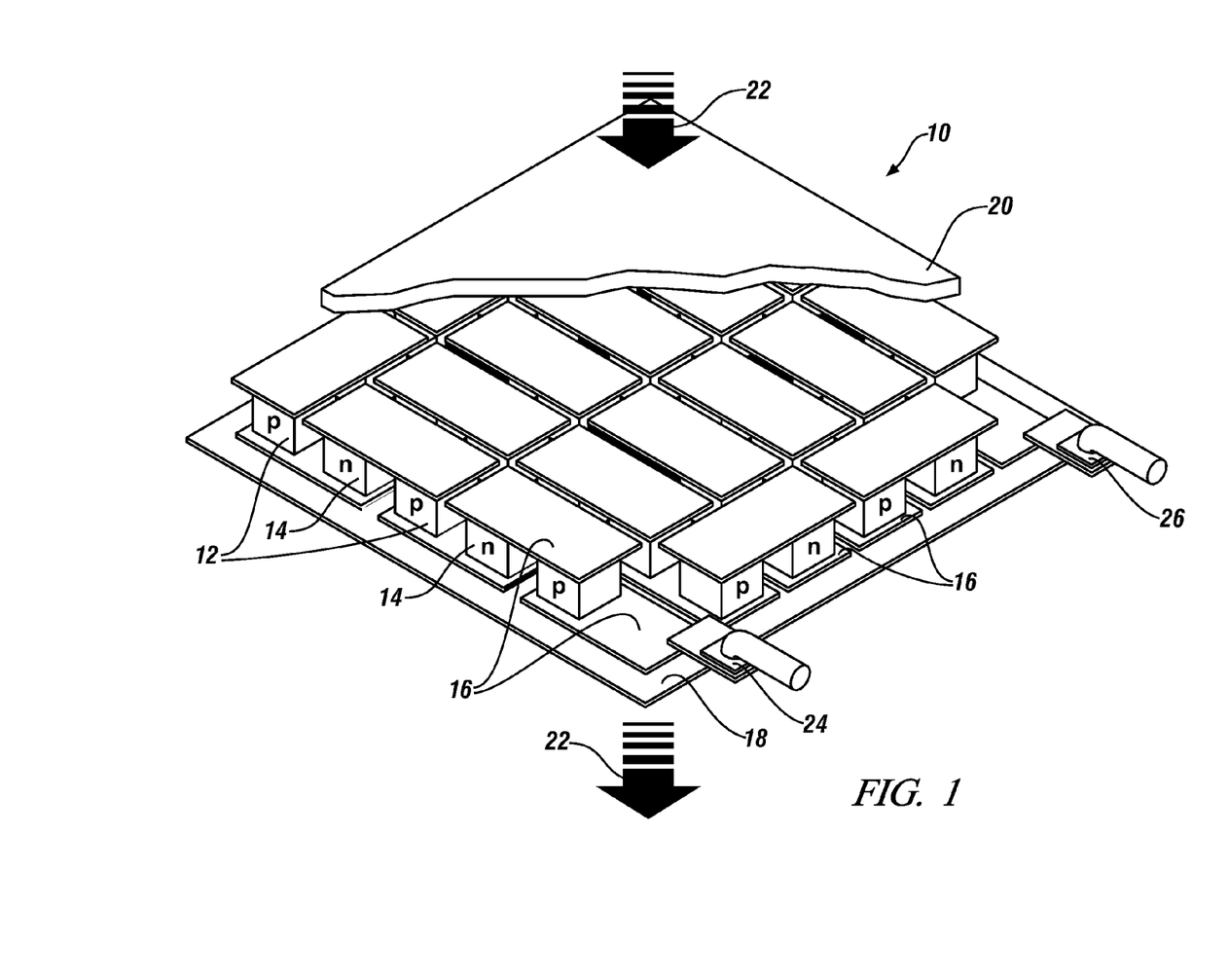
FIG. 1 shows, in partial cutaway perspective view, a representative thermoelectric device incorporating a single high temperature-side substrate and a plurality of independent electrical interconnects. As shown, the high temperature-side substrate is uppermost with the heat source-contacting surface closest to an observer.

In a first embodiment the device may have been fabricated from the elements and substrates arranged and placed as shown at FIG. 1, specifically, with the hot substrate uppermost. The shield, whose perimeter is sized to closely fit the exterior boundary of the high temperature side substrate, is positioned to surround the substrate and the enamel powder or enamel-precursor powder applied along the length of the substrate-shield joint. The assembly may then be heated to enable limited flow of the enamel powder or, if an enamel precursor is used, formation and limited flow of the enamel, to form a joint between substrate and shield. In some embodiments the single high temperature substrate may be replaced by an array comprising a plurality of spaced-apart individual substrates. This configuration may be beneficial in reducing thermal stress in the substrates. In this embodiment additional enamel or enamel precursor is applied to the gaps between substrates so that, when flowed, the enamel will adhere to the substrate edges and fill the gaps to render an oxidizing gas-impervious high temperature side substrate.

In a second embodiment the hot substrate or substrates may be placed with its/their external surface supported by a fixture. The shield may then be positioned so that the shield opening encloses the substrate(s) and enamel-precursor powder applied in suitable quantity to all gaps between substrates or between substrate(s) and shield. The assembly may then be heated to form the enamel to secure the substrate(s) and shield together. The elements and opposing substrate(s) may then be brazed in place.

In either of the above embodiments any high temperature process, including flowing the vitreous enamel and brazing of the elements should be performed in an inert atmosphere to avoid oxidation of the elements or interconnects during device fabrication.

In either embodiment, with the shield and elements in position, the gap between the underside of the shield and the element-contacting surface of the low temperature substrate may be filled with an electrically non-conductive material. This electrically non-conductive material should bond to both the shield and the substrate to form a seal and thereby fully encapsulate the thermoelectric device. Exemplary materials include epoxy, filled or unfilled, RTV silicone, and thermoplastics. This step should also be performed in an inert, atmosphere, such as nitrogen or argon, to ensure that oxygen is substantially excluded from the encapsulated thermoelectric device. Encapsulation may also be performed under greater than atmospheric pressure.

Optionally, where greater thermal insulation within the enclosure is desired or to inhibit sublimation, a silica-based sol may be introduced into the device and converted to an aerogel using methods known to those skilled in the art, before encapsulation is performed. It is not necessary that any aerogel fill the enclosure or capsule provided it may be applied to the high temperature end of the elements where sublimation will be most prevalent.

In this application the term ambient temperature or room temperature is used to characterize a temperature of about between 20-25° C. The term atmospheric air or ambient atmosphere is used to characterize air at a pressure of about one atmosphere and containing about 78% by volume of nitrogen, about 21% by volume of oxygen and about 1% of other gases. The term atmospheric pressure is used to characterize a pressure of about 1 atmosphere. The term atmospheric oxygen refers to the 21% or so by volume of oxygen found in atmospheric air. The term inert gas is used to characterize substantially pure gases or gas mixtures containing less than 5 ppm (parts per million) by volume of any gas which may react with the thermoelectric elements at their operating temperature. These reactive gases may include air, oxygen, water vapor, and carbon dioxide among others. (Metal) foil is a flat-rolled sheet product with a thickness of less than about 200 micrometers.

DESCRIPTION OF PREFERRED EMBODIMENTS

The following description of the embodiment(s) is merely exemplary in nature and is not intended to limit the invention, its application, or uses.

There is considerable interest in skutterudites with the general chemical formula $MX_3$ where M may be Co, Ir, and Rh, or a combination of Co with Ni, Fe, Rh, or Ir and X may be P, As, or Sb, as high temperature thermoelectric elements. Of these possible compositions, a preferred composition is $CoSb_3$. To render a p-type or n-type semiconductor suitable for use in thermoelectric devices, $CoSb_3$ may be doped with one or more of rare-earth elements, such as La, Ce or Eu, alkaline-earth elements, such as Ca or Ba, or alkali metal elements, such as K and Na. P-type doping is generally achieved by the substitution of a transition metal for Co on the M site. The substitutional element should be electron deficient compared to the Co which it replaces. Exemplary substitutional elements include Fe or a suitable combination of Fe and Ni. Alternating p-type and n-type elements may then be arranged into a thermoelectric device.

FIG. 1 shows a representative thermoelectric device 10, comprising a regular array of spaced-apart, alternating p-type 12 and n-type 14 thermoelectric elements connected to one another in series configuration by interconnected conductors 16 and attached to a plate or substrate at their top and bottom surfaces. Often both types of elements 12, 14 are the same size and shape. For example, they are square in cross-section for close-fitting and a few millimeters on a side. Their heights are uniform and of a few millimeters. In this illustration, seventeen p-type elements and seventeen n-type elements are alternately and progressively connected as p-type/n-type pairs in series DC connection from terminal 24 to terminal 26. In operation, the produced current flows from one terminal, up and down, through adjacent elements 12, 14 and conductors 16 to the other terminal. Such a configuration is intended to be exemplary and not limiting. Other electrical interconnection schemes may be employed, including series/parallel connections which provide some redundancy to the device in the event of a single element failure.

In this representation, it is intended that plate 20, the high temperature-side substrate, is maintained at a higher temperature than substrate 18, the low temperature-side substrate. Obviously such a temperature gradient will produce a heat flow in the direction indicated by arrow 22. Electrical terminals 24 and 26 provide connection with an external load or with another thermoelectric device. In the configuration shown connector 26 will be at a more positive electrical potential that connector 24.

In commercial planar thermoelectric devices of this general design, the gaps between p-type elements 12 and n-type elements 14 are typically much smaller than shown in FIG. 1. In such commercial devices the elements may be closely spaced with gaps sufficient only to prevent any internal short circuits arising from inadvertent contact between adjacent elements in service. The configuration shown in FIG. 1, and in subsequent figures, exaggerates these gaps for clarity of illustration only, and is not intended to suggest or teach gaps of any particular dimension or scale.

Substrates 20 and 22 are electrical insulators and serve to mechanically stabilize conductors 16 and isolate the various interconnects to avoid short circuits internal to the device.

Suitable substrate materials include $Al_2O_3$ and AlN. Substrates 20 and 22 also serve as thermal barriers, insulating the ends of the elements 12 and 14 from the thermal environment. Thus AlN, with its higher thermal conductivity is often preferred over the lower cost $Al_2O_3$.

Figure 2:
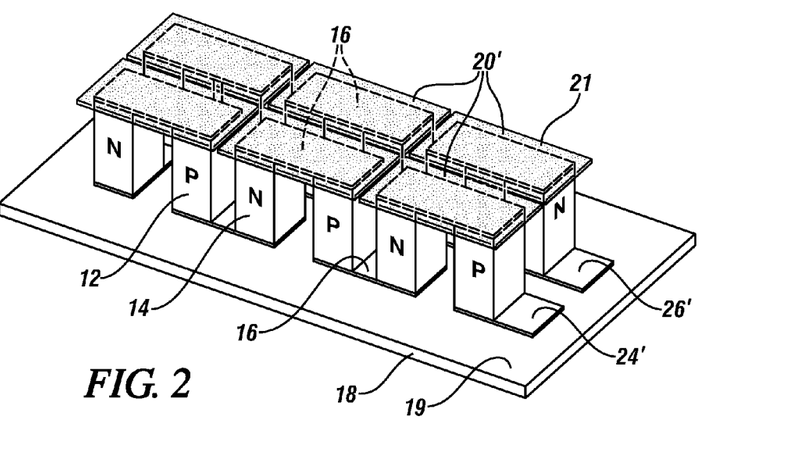
FIG. 2 shows a perspective view of a thermoelectric device incorporating a plurality of high temperature substrates each with an integral or attached interconnect. As shown, the high temperature-side substrates are uppermost with the heat source-contacting surface closest to an observer.

FIG. 2 illustrates an alternative construction which employs, as in FIG. 1, a single low temperature-side substrate 18 but, instead of the single high temperature-side substrate of FIG. 1, a plurality of high temperature-side substrates 20'. Such a design might be preferred for short production runs of thermoelectric devices, since the individual substrates 20' may be positioned in multiple ways depending on the overall geometry of the device, and so will be more flexible than single large substrate 20. A plurality of substrates may also be advantageous where the thermoelectric device is laterally extensive or where the heat source exhibits spatially non-uniform temperatures. In either of these circumstances significant thermal gradients may occur in the plane of the substrate leading to the development of in-plane thermal stresses better accommodated by an array of discrete substrates than a single substrate. Of, course, for large production runs of fixed-geometry devices, large substrate 20 offers significant handling benefits. This ease of handling may be exploited for devices incorporating a plurality of substrates by first fabricating the device with a single extensive substrate and suitably positioned elements. The single extensive substrate may then be cut or sliced appropriately to develop the desired plurality of substrates. The practices of the invention apply to both device geometries but further discussion will be directed to those employing a plurality of smaller substrates 20'. Methods of extending or simplifying the processes and procedures to designs using a single substrate 20 will be readily comprehended by those of skill in the art.

Substrates 18 and 20' incorporate integral interconnects 16 coated, for example by physical or chemical vapor deposition, or, with appropriate pre-treatment, plated or sintered directly on the appropriate substrate. Suitably, any conductive metal may be employed as an interconnect, but preferably its coefficient of thermal expansion (CTE) should be reasonably well matched to the CTE of the thermoelectric elements. Copper is commonly used for most commercially available $Bi_2Te_3$ power generating modules, in part, because of the ease with which it may be brazed. For the $CoSb_3$-based thermoelectric compositions frequently used in high temperature thermoelectric devices, copper remains suitable, but aluminum has also been used. Of course, the brazing alloy used to secure the elements to the interconnects should be compatible with the interconnect composition. Suitable brazing alloys may be based on compositions which melt at about 600° C., such as Al—Si alloys (compatible with aluminum interconnects) or silver-containing compositions (compatible with copper interconnects) but higher-melting copper-based compositions which first melt at about 643° C. may also be suitable.

High temperature thermoelectric devices, such as those intended to extract waste heat from automobile engine exhaust gas, may be exposed to temperatures of between 400° C. and 600° C. At these temperatures unprotected thermoelectric elements may degrade since they may be subject to one or more of, vaporization, sublimation, or oxidation if operated in air. For $CoSb_3$-based thermoelectric compositions, sublimation and oxidation are concerns at these elevated device operating temperatures. To reduce both sublimation and oxidation, the device may be sealed. The seal should exclude atmospheric oxygen and water vapor, and preferably the device elements should be shrouded in an inert, non-oxidizing gaseous atmosphere, comprising, for example, nitrogen or argon or similar gases or gas mixtures.

The device may incorporate, around the periphery of the substrate(s), a thin shield or skirt of a suitable, oxidation-resistant metal or alloy. The shield may have the form of a thin-walled, open shape with an opening shaped and sized to closely match the geometry and dimensions of the substrate or substrate array periphery so that it may substantially seal the edges of the device. But, in plan view, each length dimension may be oversized by about 1-3% so that the shield may be slipped freely over the thermoelectric array substrate(s), without creating large gaps between the thin-walled shield and the substrate. The width of the wall of the thin-walled shield should be slightly less than the thickness of the devices so that if one edge of the thin-walled shield is secured to the hot substrate, the other edge will be slightly elevated above the thermoelectric element-contacting surface of the cold substrate.

Figure 3:
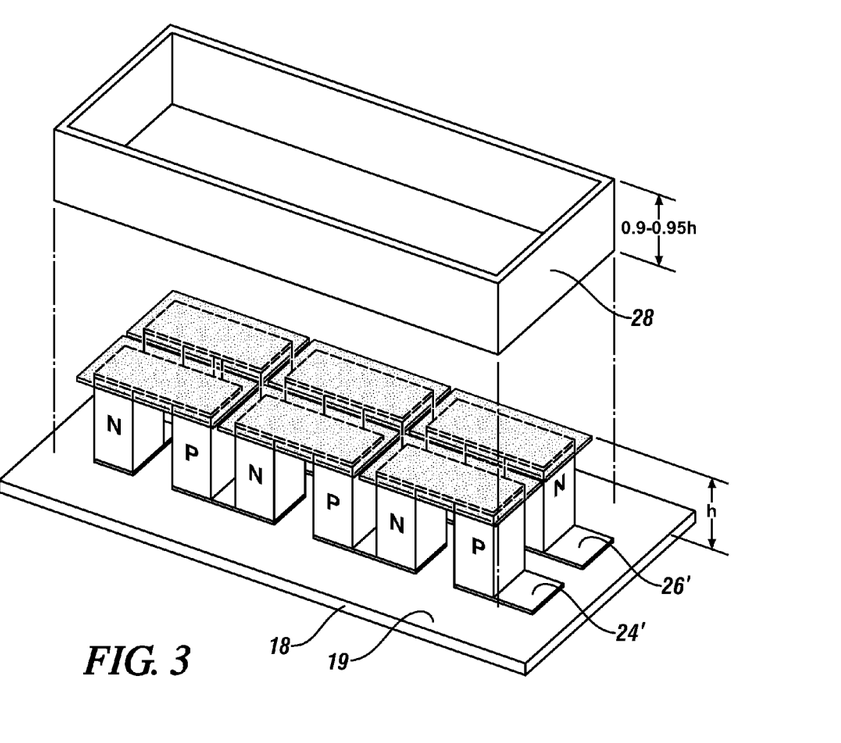
FIG. 3 shows, in exploded perspective view, the thermoelectric device of FIG. 2 and a thin-walled shield suitable, when positioned and secured, for inhibiting ingress of oxygen into the device.
Figure 4A:
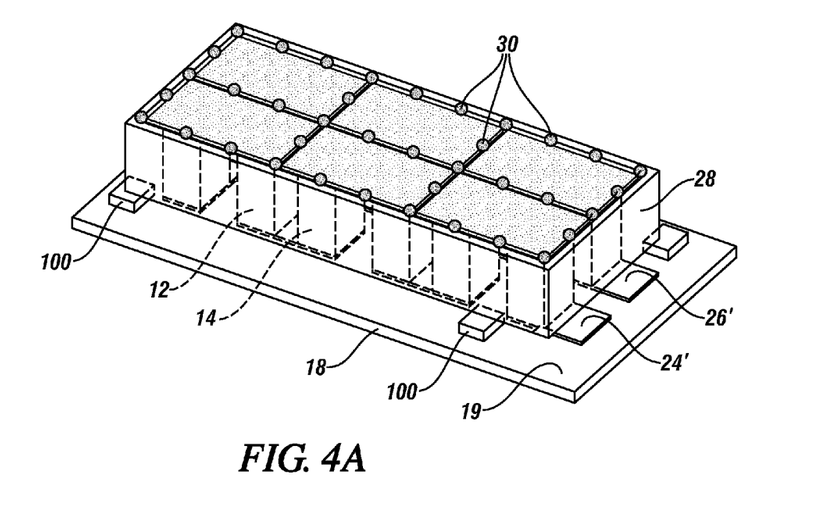
FIG. 4A shows, in perspective view, the thermoelectric device of FIG. 2 with the shield of FIG. 3 in position. The figure further shows enamel or enamel-precursor, pellets or particles, suitably placed to join the shield to those high temperature substrates positioned on the device perimeter and to seal gaps between adjacent substrates. The shield is shown suitably elevated from the low temperature substrate using removable spacers or supports.
Figure 4B:
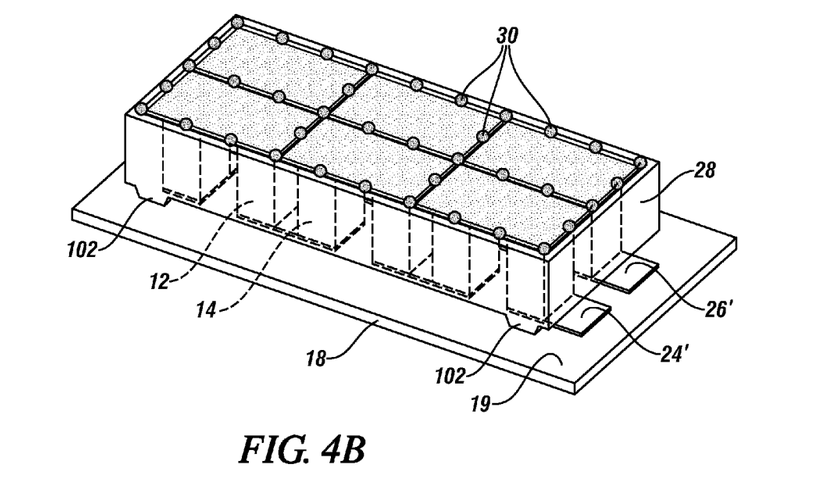
FIG. 4B shows, in perspective view, the thermoelectric device of FIG. 2 with a modified shield in position, with enamel or enamel-precursor, pellets or particles, suitably placed to join the shield to the those high temperature substrates positioned on the device perimeter and to seal gaps between adjacent substrates. The shield is suitably elevated from the low temperature substrate by integral feet or shield extensions.

A representative shield 28 and its positioning with respect to the elements and substrates is illustrated at FIGS. 3 and 4. It will be appreciated that this particular geometry and arrangement of the elements and substrates is merely illustrative and not limiting and that the invention comprehends alternative shield, element and/or substrate configurations.

Since the shield serves as a barrier to oxygen it is important that the shield be made of a material which is itself oxidation resistant in the 400° C.-600° C. temperature range of interest. Further, the shield offers an alternate thermal path so that some portion of heat flow 22 (FIG. 1) may be diverted to flow through the shield. Any heat flowing through the shield and by-passing the thermoelectric device (shunting) will lower the efficiency of the thermoelectric device. To minimize this shunting effect, it is preferred that the shield material has a low thermal conductivity, and be fabricated of thin gage material. The foil composition and thickness should be selected to reduce thermal shunting to less than about 5%. Suitable shield materials include stainless steels containing at least 11% by weight of Cr so that the stainless steel forms a protective oxide film. Both 300 series (austenitic) and 400 series (ferritic) grades are suitable and are available in foil gages. A preferred thickness range is from 10 to 100 micrometers. Particular examples include SS304, SS316 and SS430. Commercial purity titanium, also available in foil gages, may also be suitable.

As noted, all of these materials may be obtained as thin foils of thickness less than 200 micrometers. Typically, for good dimensional control, as discussed further below, it will be preferred to blank or die-cut appropriately-dimensioned and shaped strips from such foil, form the strip into an annulus by folding it back on itself, and secure the ends of the annulus to one another. Any suitable joining process may be used, such as, welding or brazing provided the joining process is performed over the entire width of the strip so that no path for infiltration of atmospheric air and oxygen is left or created. Lap and butt joining geometries may be used, again subject only to the requirement that the joint be leak-tight to atmospheric air. Suitable welding processes may include laser butt welding or ultrasonic lap welding.

It is intended that the shield interfere only minimally, if at all, with the functioning of the thermoelectric device. Thus, in general, the shield should not protrude beyond surface 21 (FIG. 2) of substrate 20'. Also shield 28 should not contact electric terminals 24, 26 (FIG. 1) or 24', 26' (FIGS. 2-6) since otherwise an electrical short circuit will result. For these reasons the height of the skirt should be about 0.9-0.95 of the height 'h' measured from the electrode-contacting surface 19 of substrate 18 to surface 21 of substrate 20' (shown at FIG. 2). The height of the shield is thus between 0.9 and 0.95 of the sum of, the length of the elements, the thickness of the two opposing interconnects, and the thickness of the high temperature side substrate. Thus shield 28, when lowered into position as shown in FIG. 4A, may be supported on discrete removable spacers 100, to elevate an edge of the wall to the same height as the heat source-contacting surface of the high temperature substrate. In an alternative embodiment 'feet' 102 may be incorporated into, and made integral with shield 28 as shown at FIG. 4B to serve the same purpose. Placement of feet 102 or spacers 100 should be such that these supports do not introduce electrical short circuits between electrical contacts 24, 26 or 24', 26'.

Figure 13A:
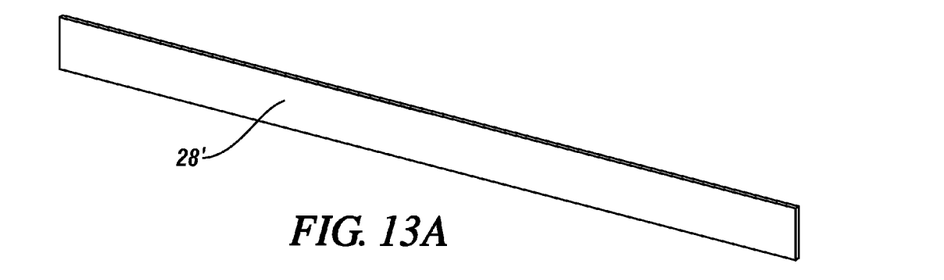
FIGS. 13A-D show, in perspective view (FIGS. 13A, 13B) and exploded perspective view (FIG. 13C), a method of fabricating a shield, and illustrate, at FIG. 13D, one possible shield wall geometry in sectional view.
Figure 13B:
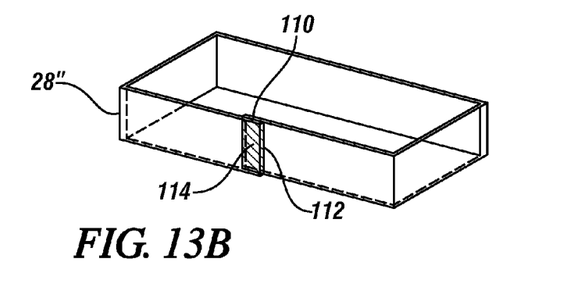
Figure 13C:
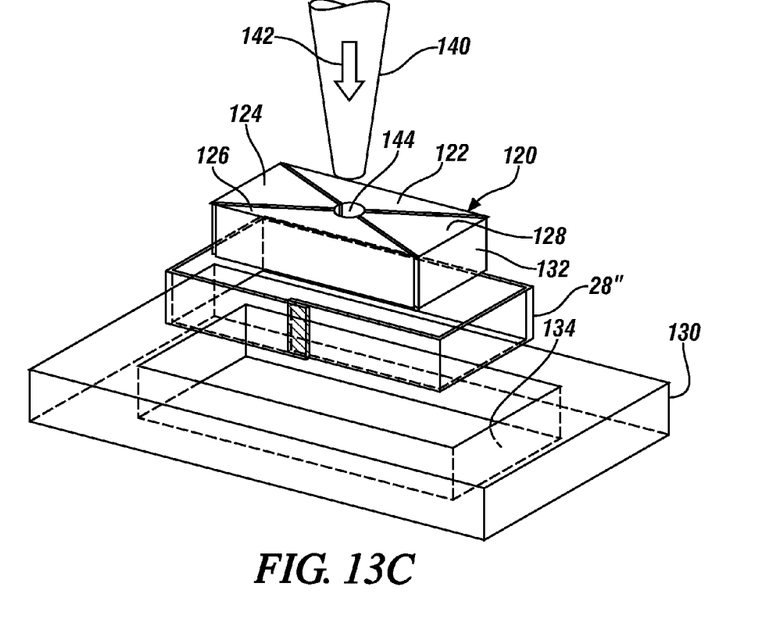
Figure 13D:
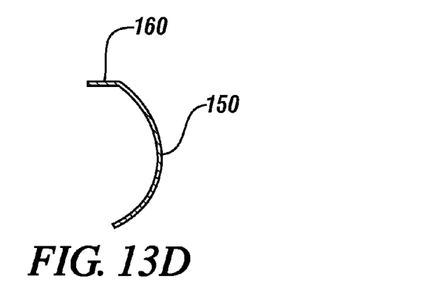

If shield 28 can protrude beyond surface 21 of substrates 20' without interfering with the thermal access of the heat source to surface 21 then shield 28 may be shaped to include a lip on its upper, hot substrate-contacting end, as shown at 160 at FIG. 13D, so that the underside of the lip will rest on surface 21 of substrate 20' and support the shield so that supports 100 or legs 102 are unnecessary.

In this embodiment, the gaps 'x' between adjacent substrates, in configurations employing a plurality of substrates, as well as the gap 'x' between substrate and shield (FIG. 5) should be in the range of 25 to 150 micrometers. In some devices, gaps of greater than about 150 micrometers may be present, for example, where the thermoelectric elements are non-uniformly distributed to accommodate a heat source with a non-uniform temperature distribution. In this situation, any spacing greater than about 150 micrometers, may be partially filled with metal strips or shaped, cut metal pieces, to restore the gaps between adjacent constituents to the desired range. This limits the extent of the gap which will be spanned by the vitreous enamel as described below and so minimizes the thermal stresses to which the enamel is subjected during service. Of course, the metal strips should be compatible with the enamel and thinner than the substrates. Any of the materials previously mentioned as suitable as shield materials will be appropriate.

Pellets or particles 30, which may be ground, pre-vitrified compositions or enamel precursor compositions prepared from compacted, intimately-mixed, finely-ground ceramic powders, are then applied in suitable quantity to each gap, including the gaps formed between adjacent substrates and the gap between the substrates and the shield as shown at FIG. 4A. When fired at a suitable temperature, these pellets or particles will form a vitreous, flowable enamel. A suitable exemplary material is Thomson Enamel '6000 clear' from Thomson Enamel, PO Box 310, Newport, Ky. 41072. As determined by Energy Dispersive X-ray Analysis (EDAX), this enamel contains, as major constituents, silicon, sodium, and oxygen in approximate proportion, by weight, of 1:1:3.5 with lesser quantities of nitrogen, fluorine, aluminum, calcium and barium. This enamel bonds well to oxides and other ceramics, as well as to copper. This enamel also has a coefficient of thermal expansion comparable to that of stainless steel and so minimizes the development of thermal stresses during in-service temperature cycling. Adhesion of the enamel to stainless steel may be promoted by briefly heating the stainless steel to promote oxide growth or by roughening the stainless steel surface.

Pellets or particles 30, are sized so that they are larger than the dimensions of the gaps, that is, greater than about 150 micrometers. If the pellets comprise fine powders of appreciably less than 150 micrometers or so, a minimal quantity of organic binder may be employed to bind the particles together to shape the pellet. On firing at a predetermined temperature for a suitable length of time, typically about 650° C. for an hour for the exemplary '6000 clear' enamel, the powder will form a flowable enamel which will be drawn into and maintained in the gaps 'x' by capillary action in a manner analogous to soldering or brazing with metals. The volume of powder (or the quantity of pellets if substantially uniformly sized) should thus be matched to the volume of the gaps. It is preferred that the firing temperature be predetermined to render the enamel flowable and capable of adhering to the substrates and shield, but sufficiently viscous that only limited flow will occur. Thus, numerous, generally uniformly distributed, pellets are preferred. For this reason it is preferred that the pellet size not exceed 1000 micrometers with a maximum size of about 500 micrometers being more preferred. Heating should be conducted in an inert atmosphere, to avoid degrading the thermoelectric elements during the firing process. For thermoelectric compositions which do not undergo extensive sublimation, heating in vacuum may also be appropriate.

Figure 5:
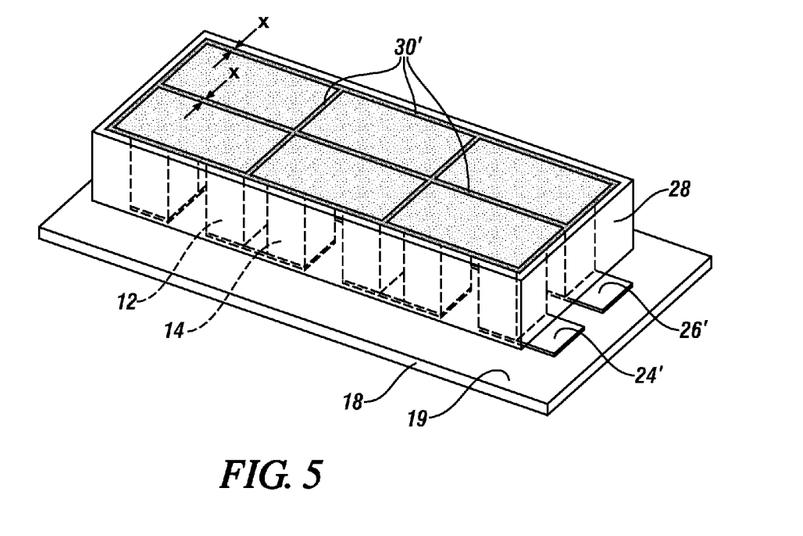
FIG. 5 shows, in perspective view, the device of FIG. 4A after firing at a temperature sufficient to flow the flowable vitreous enamel and after removal of the supports.

On cooling the flowable enamel will solidify into glass 30' as shown at FIG. 5 and will serve as a barrier to ingress of oxygen from atmospheric air. Although depicted in FIG. 5 and other figures as smooth-surfaced, glass 30' may have a 'lumpy' appearance reflecting the original pellet/particle placement due to the limited flow which has occurred. Thus the generally air-impermeable ceramic substrate(s) and the enamel will cooperate in forming a gas-impermeable barrier, particularly an air-impermeable barrier, to ingress of any gaseous oxidizing species through the hot surface of the device.

Figure 6:
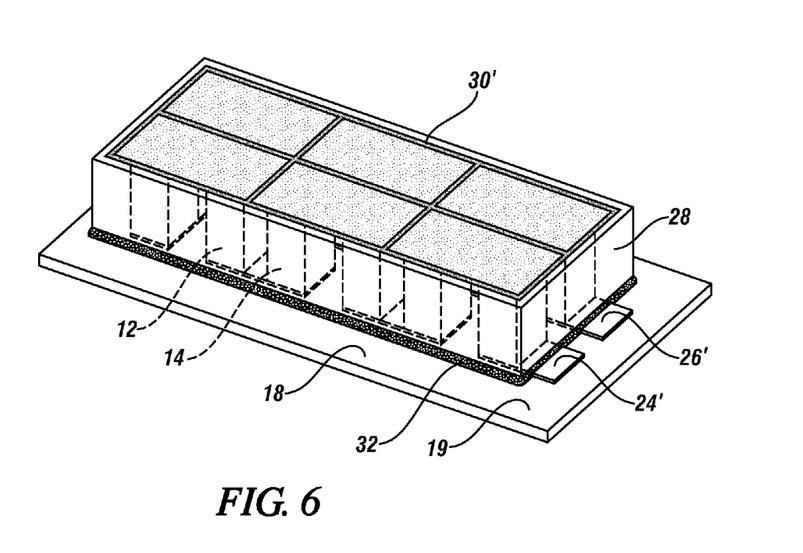
FIG. 6 shows, in perspective view, the fully-sealed device after application of epoxy or RTV silicone or polymer to seal the gap between the free edge of the shield and the element-contacting surface of the low temperature substrate.

Final sealing of the device is accomplished by applying a flowable seal material 32 such as a low temperature-curing epoxy, or RTV silicone or a thermoplastic polymer above its glass transition temperature to the gap between the unsecured shield end and surface 19 of low temperature substrate 18 as shown at FIG. 6. As used herein, a low temperature curing material is one which will cure in 24 hours or less at room temperature, or between about 20° C. and 25° C. or so under a relative humidity of about 50% or so. In practice of the invention the cure conditions may be adjusted to enable more rapid cure.

Optionally the seal material may be reinforced with electrically non-conductive fillers such as fibers, for example glass fibers, or filled with particles or flakes of silica, calcium carbonate, or clays. Prior to sealing, the device should be placed in a chamber and the chamber evacuated to remove substantially all air, oxygen and water vapor from the partially sealed device. Final sealing may then be performed under inert atmosphere such as nitrogen or argon so that the interior of the device is filled with the inert atmosphere. Optionally the inert atmosphere may be at mildly elevated pressure, say 1 to 10 pounds per square inch or so greater than atmospheric pressure, to inhibit sublimation of the thermoelectric elements in service. Such pressure should be maintained during cure or cooling of the sealing material.

It has already been noted that the high temperature-side substrate may be subjected to temperatures of as high as 600° C. However the 'cold' substrate, if cooled by circulating engine coolant may routinely reach temperatures of 100° C. or so during vehicle operation, and, on vehicle shutdown when engine coolant is no longer circulated, may appreciably exceed 100° C. Where the 'cold' temperature is maintained by airflow past the moving vehicle, even higher temperature spikes might arise on vehicle shutdown. Thus, the selected organic sealant should be capable of experiencing such operating temperatures and temperature spikes without degrading. Additionally the sealant should be capable of withstanding temperatures representative of temperatures encountered in the northern United States in winter. Thus, suitable candidate sealants should be capable of withstanding maximum temperatures of between about 150° C. and 175° C. and minimum temperatures of down to about −30° C. Exemplary compositions may include: formed-in-place gasket material, high temperature Permatex (10 Columbus Boulevard, Hartford, Conn. 06106) RED RTV silicone, suitable for service temperatures ranging from about −50° C. to about 315° C.; Aremco Products (707 Executive Blvd., Valley Cottage, N.Y. 10989) Ultra high Temperature Epoxy 526N, suitable for service temperatures ranging from about −60° C. to about 300° C.; and MG Chemicals (9347, 193rd Street Surrey, British Columbia, Canada V4N 4E7) 832 HT High Temperature Epoxy, suitable for service temperatures ranging from about −30° C. to about 200° C. As pointed out previously, a thermoplastic polymer may also be used. Suitably, to retain low temperature flexibility the selected polymer may be an elastomer but the high temperature requirement limits the range of suitable elastomer families. However, several thermoplastic polyether block amide (PEBA) compositions with melting points ranging from about 174° C. to 195° C. may be suitable.

The shield 28 has been shown in FIGS. 2-6 as vertically-sided. In general this geometry will be preferred since such a geometry may be readily fabricated. In operation, the thermoelectric device will of course expand as it is exposed to heat and the expansion of the thermoelectric elements will differ from that of the shield material. In most applications, any mismatch in the extent of expansion may be accommodated by the higher compliance/lower stiffness epoxy, silicone, or thermoplastic. But, where these sealing agents have been extensively reinforced or filled, their compliance may be inadequate to compensate for the mis-match. In this circumstance it may be desirable to introduce some shape into the skirt to permit it to readily flex under load to accommodate the mismatch. A simple, convex-outward, bowed skirt shape as shown at 150 of FIG. 13D may be used, but inclined wall shapes and walls with one or more steps may also be suitable.

If gaps of up to 150 micrometers cannot be consistently maintained so that larger gaps (>150 micrometers) may occur, then the procedure constituting the second embodiment illustrated at FIGS. 7-12 may be followed. Again, some of the larger inter-substrate spacings may be partially filled by metal strips as described in discussion of the first embodiment to enable a reduced vitreous enamel span of 150 micrometers or less.

The previous embodiment was successful in locating the vitreous material where it could serve as a barrier against ingress of air for two reasons. First, because the powder was consolidated into pellets or particles which were larger than the gaps, the vitreous enamel powder or vitreous enamel precursor powder was prevented from falling through the gaps. Second, the affinity of the liquid enamel for oxides and oxidized metal surfaces coupled with its viscosity and surface tension, managed by the choice of firing temperature, supported the liquid and maintained it in the gaps rather than dripping into the interior of the device so that, upon solidification it formed the desired barrier. Where larger gaps are present, larger size particles or pellets will be required and, more significantly, if any of the molten liquid cannot be maintained in the gaps and drips into the interior of the device it will leave an opening or pore behind allowing ingress of air.

A suitable barrier may still be obtained by casting the vitreous enamel against a surface to which it will not adhere. Generally, these include metallic nickel, and low chromium steels such as plain carbon or mildly alloyed steels. Steels with less than about 10% or so of chromium are suitable, but plain carbon steels are preferred.

Figure 7:
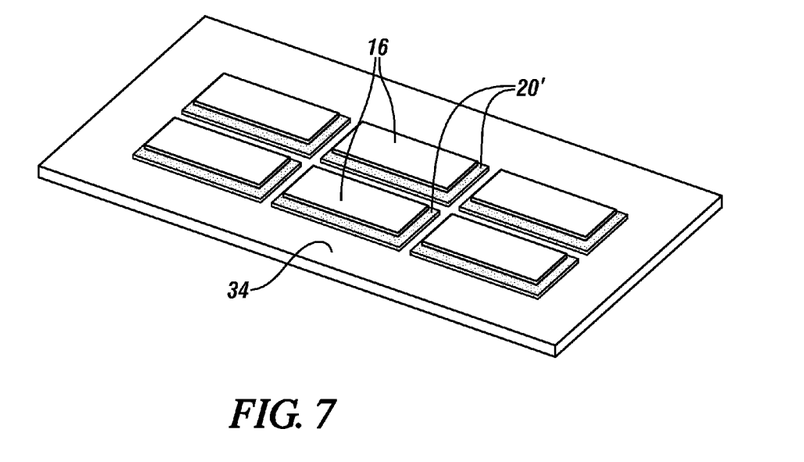
FIG. 7 shows, in perspective view, an array of high temperature substrates with integral interconnects supported on a backing plate with their heat source-contacting surface in contact with the backing plate and the interconnects uppermost.
Figure 8:
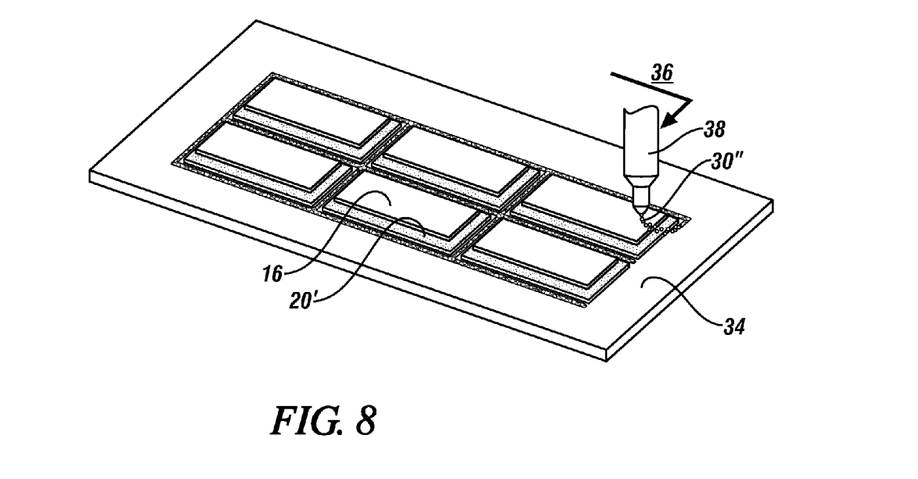
FIG. 8 shows, in perspective view, the array of high temperature substrates of FIG. 7 with the addition of enamel or enamel-precursor, powder to the gaps between adjacent substrates and around the perimeter of the substrate array.
Figure 9:
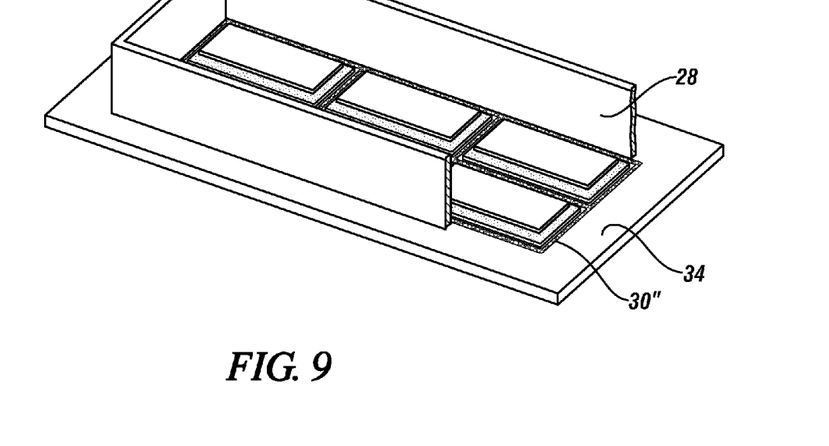
FIG. 9 shows, in perspective view, the array of high temperature-side substrates and enamel precursor powder of FIG. 8 and further including a shield placed around the perimeter of the substrate array. The assembly is shown after firing of the assembly at a temperature sufficient to render the enamel flowable so that it may fill the gaps between substrates and, on cooling, secure the shield to the substrate array.
Figure 10:
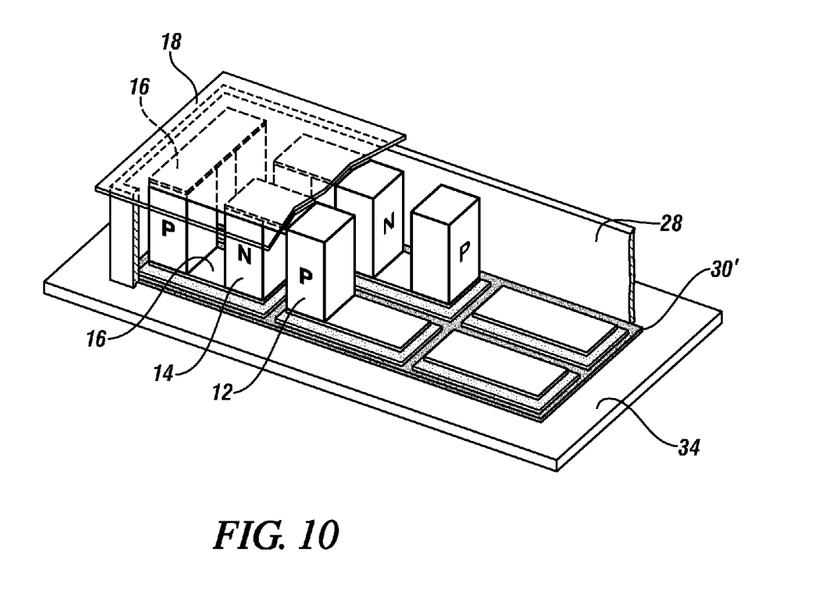
FIG. 10 shows, in perspective view, the high temperature-side substrate array and shield of FIG. 9 after appropriate placement of n-type and p-type thermoelectric elements and a low temperature substrate with integral interconnects. The view shown represents the structure after brazing the elements to the interconnects to form a thermoelectric device.

As shown at FIG. 7, a plurality of spaced-apart substrates 20' is positioned on a backing plate 34 with conductors 16 uppermost. The gaps between the substrates may then be filled with a suitable quantity of enamel or enamel precursor powder. This powder may be applied as pellets or particles 30 as shown at FIG. 4 or dispensed as a fine powder stream 30" through dispenser 38 which traces out a suitable path to apply the powder where needed as shown at FIG. 8. The most recent path followed by dispenser 38 is indicated by arrow 36 and traces the outline of one of the substrates 20'. Shield 28, shown in partial cutaway, may then be placed in position (FIG. 9) and further powder (if necessary) dispensed to ensure that the gap between the shield wall and the perimeter of the substrate array is fully charged with powder. Upon heating, again under inert atmosphere to avoid oxidizing conductors 16, the powder will melt, flow to fill all gaps and create an air-impermeable vitreous enamel 30' barrier in all gaps. This structure now forms a foundation for addition of thermoelectric elements 12 and 14 as well as cold substrate 18, also incorporating conductors 16, as shown at FIG. 10.

Figure 11:
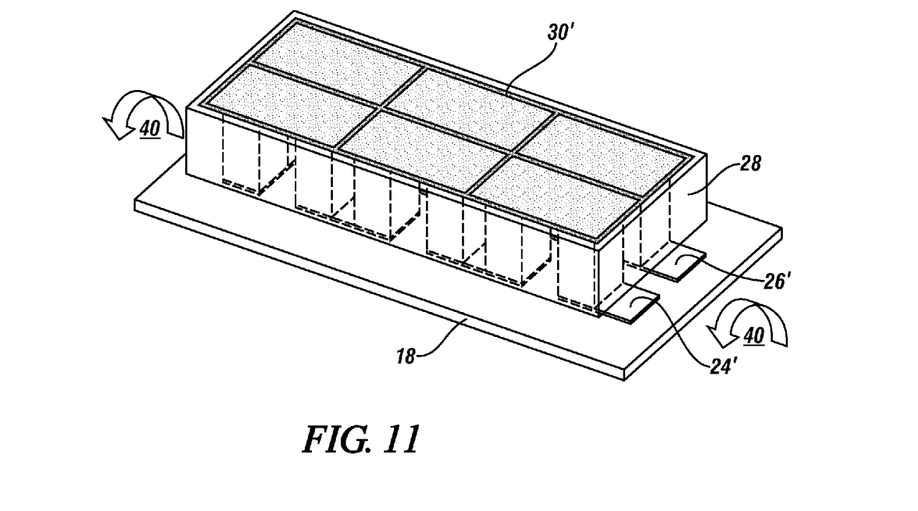
FIG. 11 shows, in perspective view, the thermoelectric device of FIG. 10 after removal from the backing plate and inverted.
Figure 12:
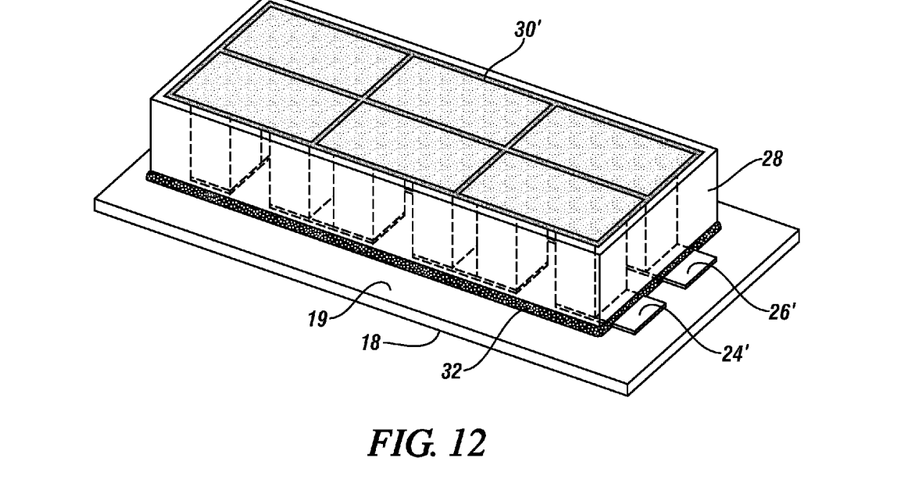
FIG. 12 shows, in perspective view, a sealed thermoelectric device comprising the thermoelectric device of FIG. 11 after application of epoxy or RTV silicone or polymer to seal the gap between the free edge of the shield and the element-contacting surface of the low temperature-side substrate.

When device assembly is complete, the structure may be separated from backing plate 34, and inverted as indicated by arrows 40 and shown at FIG. 11. The assembly is now ready for application of filled or unfilled epoxy, RTV silicone or a suitable thermoplastic to fill the gap between the unsecured end of shield 28 and surface 19 of substrate 18 as shown at FIG. 12 for final sealing or encapsulation of the device. As in the previous embodiment, sealing should be performed under inert atmosphere and, optionally, under greater than atmospheric pressure.

In both embodiments the device, during fabrication is subjected to more than one thermal cycle since the thermoelectric elements are physically and electrically connected to the conductors by brazing and the enamel-precursor powder is melted. In some circumstances it may be feasible to perform both processes in a single operation but generally two thermal cycles will be required because the temperatures required for brazing and for melting of the enamel will be different.

For the selected exemplary enamel '6000 clear' composition, no flow is observed at a temperature of about 600° C., some flow occurs at about 650° C. and extensive flow occurs at 700° C. This behavior may be exploited to ensure that the vitreous enamel shield remains intact and continues to serve as an air and oxygen-excluding barrier during subsequent brazing operations. The brazing temperature depends on the composition of the braze alloy and two families of braze alloys may suitably secure $CoSb_3$ thermoelectric elements to a conductor. The two families of braze alloys are based on aluminum-silicon alloys and copper alloys respectively. Members of the aluminum-silicon-based braze alloy family generally melt at a lower temperature than the members of the copper-based braze alloy family.

With few exceptions, for example eutectic alloy $Cu_{75.9}Ag_{17.6}P_{6.5}$ which melts at 643° C., braze alloys do not exhibit a unique melting point but rather a melting range defined by a solidus temperature at which liquid is first formed and a liquidus temperature at which no solid remains. Since the braze alloy should be completely molten during the brazing process the liquidus temperature must be attained or exceeded during the process.

In the first embodiment, the thermoelectric device may be fully assembled and brazed prior to sealing by enameling. Since the enameling temperature for the exemplary Thomson Enamel '6000 clear' enamel is about 650° C. the braze alloy should preferably have a solidus temperature greater than 650° C., although if the melting range is large say 100° C. or more, some minor melting might be acceptable enabling a solidus temperature of 640° C.-650° C. or so provided the liquidus temperature is not so high as to degrade the thermoelectric elements during brazing, even when conducted under inert atmosphere. Some suitable compositions with solidus/liquidus temperatures in parentheses may include: $Cu_{86.8}Sn_7P_{6.2}$ (657/688° C.); $Cu_{92.8}P_{7.2}$ (710/793° C.); and $Ag_{40}Cu_{30}Zn_{30}$ (674/727° C.).

In the second embodiment the thermoelectric device will be brazed after the vitreous enamel is applied, so that the liquidus temperature of the braze alloy should not exceed the temperature at which the enamel will undergo extensive flow. For the exemplary Thomson Enamel '6000 clear' enamel, which undergoes extensive flow at about 700° C., suitable braze alloys may include: $Al_{94.75} Si_{5.25}$ (575/630° C.); $Al_{92.5} Si_{7.5}$ (575/615° C.); and $Al_{90}Si_{10}$ (575/590° C.), all of which are suitable for aluminum interconnects. Where sustained temperatures of about 600° C. or so will be encountered in service, a higher melting point brazing alloy such as eutectic alloy $Cu_{75.9}Ag_{17.6}P_{6.5}$ (643/643° C.) which is suitable for copper interconnects may be preferred. Of course, the use of higher flow temperature enamels will enable the use of higher melting temperature braze alloys.

The particular thermoelectric elements, vitreous enamel composition, brazing alloy compositions, and temperatures cited above are exemplary and not limiting. For example, alternate vitreous enamels may be employed provided they satisfy the requirements of being substantially impermeable to air/oxygen, bond to the substrate and shield materials, do not react with the thermoelectric elements, and have a coefficient of thermal expansion (CTE) generally equal to the CTE of the shield material. Also, thermoelectric elements of differing composition, and optimized for operation over different temperature ranges, may be substituted for the exemplary $CoSb_3$ composition, possibly requiring selection of alternate brazing alloy and the vitreous enamel compositions.

As noted previously, the allowable gap between the shield and the perimeter of the substrates in the first embodiment is small. The shape of the shield perimeter must also closely conform to the shape outline of the substrates. One approach to obtaining shields with consistent outline dimensions and shape is illustrated at FIGS. 13A-C.

FIG. 13A illustrates a strip of shield material 28', either sheared from a foil strip or, more preferably die cut from a foil strip or sheet. In FIG. 13B the foil strip has been shaped into shield precursor 28", possibly by forming around a mandrel (not shown). Shield precursor 28" will generally approximate the shape and dimension of shield 28. In the embodiment illustrated, the ends 110 and 112 of strip 28' have been overlapped to create a joining region 114 adapted for brazing or for ultrasonic or laser welding or other means of securing the foil end regions to one another and forming a leak-proof joint. In some applications this degree of shaping and sizing may be sufficient so that shield precursor 28" may be identified as shield 28 and used directly. In embodiments where more precise sizing or further shaping is preferred, further processing may be performed.

In an exemplary and non-limiting embodiment of such further processing, shield precursor 28" may be placed in a die set formed of split punch portion 120 comprising independently movable punch segments 122, 124, 126, and 128 and die 130 as shown at FIG. 13C. Shield precursor 28" is positioned between the punch segment forming surfaces, for example, surface 132 of punch segment 128, and the complementary die forming surface, for example, surface 134. Tapered rod 140, when inserted into opening 144 formed by segments of each of punch elements 122, 124, 126, and 128, and advanced in the direction of arrow 142 will displace the forming surface of each of die elements 122, 124, 126, and 128 into contact with the corresponding and complementary forming surface of die 130. For example face 132 of punch element 128 will advance into contact with surface 134 of die 130. As the punch segments are displaced outward they will expand shield precursor 28" to the desired dimensions and impart a desired wall shape. For example, and without limitation, the outwardly curved wall shape with curve 150 and lip 160 shown in the sectional view at FIG. 13D.

In addition to oxidation, thermoelectric elements may degrade due to sublimation. This may be a concern with $CoSb_3$-based compositions. Sublimation may be inhibited by employing an inert gas at greater than atmospheric pressure or, alternatively by at least partially filling the device with aerogel, a porous, low thermal conductivity material formed from a gel. Oxide-based gels, commonly silica-based, will be suitable precursors since they will yield electrically-insulating as well as thermally insulating aerogels after suitable processing.

A representative procedure involves mixing TEOS (Tetraethoxysilane or tetraethyl orthosilicate, $Si(OC_2H_5)_4$) with ethanol to form an alkoxide solution to which is added, in suitable proportion, a solution of ammonium fluoride and ammonium hydroxide dissolved in a water/ethanol mixture. The resulting reaction forms a sol. The sol is initially castable and may be poured into a thermoelectric device before final sealing with epoxy etc. For example, by placing the device with its high temperature-side substrate down, that is, as shown in FIG. 10, and the with shield attached only to the high temperature-side substrate(s) by enamel, the shield will act as a dam. Although the reduced height of the shield limits the depth to which the sol may be poured, sufficient sol may be introduced to cover the majority of the length of each element and particularly at least the hot end of each element where sublimation will be most prevalent.

The sol will gel after about 10-30 minutes and may then be supercritically dried to form an aerogel at least on the hot, most sublimation-prone, portion of the elements. Even under supercritical drying some shrinkage of the sol may occur during its transformation to an aerogel. The extent of such shrinkage may be reduced by addition of fumed silica or quartz fibers to the sol. Final sealing of the shield to the substrate with epoxy or similar under inert atmosphere as described previously may now be performed. Such an aerogel will also be effective in reducing efficiency losses due to convection within the device.

Alternatively, an ambiently dried aerogel can be used. Suitably, methyl-trimethoxysilane may be combined with de-ionized water, sodium hydroxide and methanol to form a clear solution. Titania powder (for opacification) and quartz fibers (for control of shrinkage and maintenance of the microstructure during drying) may be added during the mixing process.

While preferred embodiments of the invention have been described and illustrated, these are not intended to limit the scope of the invention.

The invention claimed is:

1. A method of fabricating a thermoelectric device intended for use at elevated temperatures in an oxidizing environment, the device comprising a plurality of like-shaped, electrically-interconnected, thermoelectric elements, each having opposed mounting faces spaced apart by a generally common length; and, a plurality of air impervious ceramic substrates comprising one low-temperature side substrate adapted for thermal communication with a heat sink, and opposing the low-temperature side substrate, a plurality of high temperature-side substrates adapted for thermal communication with a heat source, each of the substrates being thermally conducting and electrically insulating and each of the substrates incorporating one or more electrical interconnects, the method comprising:

arranging the thermoelectric elements in a predetermined assembly pattern in which the thermoelectric elements are spaced apart with their opposed mounting faces in contact with the electrical interconnects on the opposing substrates to form an assembly, each of the elements and high temperature-side substrates being spaced apart and separated by gaps, and at least the high temperature-side substrates being shaped and arranged in a pattern having a perimeter adapted to promote thermal communication between the heat source and a heat source-contacting surface of the one or more substrates;

positioning a continuous, upstanding, thin-walled, oxidation-resistant metal shield around the perimeter of the assembled high temperature substrates, the shield comprising a wall with a height and bounded by opposing first and second edges, the first edge being generally aligned with the heat source-contacting surface of the one or more high temperature-side substrates so that the first edge does not extend beyond the heat source-contacting substrate surface and the wall extending toward the low temperature-side substrate, the wall outlining an opening shaped and sized substantially like, but larger than, the perimeter of the assembled high temperature substrates so that a gap is formed between the shield wall and the assembled high temperature substrate perimeter, the wall having a height predetermined to maintain the second wall edge in spaced apart relation to the low temperature-side substrate to create a space between the low temperature-side substrate and the second wall edge; then sealing the gaps between the individual high temperature-side substrates and gap between the high temperature side substrate perimeter and the shield wall with an air-impervious vitreous enamel; and securing the second edge of the wall to the low temperature substrate with a polymer so that the thermoelectric elements are located in a sealed environment within an enclosure formed of the low temperature substrate, the high temperature substrates, the shield, the vitreous enamel and the polymer, all of which cooperate to exclude oxidizing gas from the enclosure interior.

2. The method of claim 1 further comprising securing the elements to the interconnects.

3. The method of claim 1 wherein the thermoelectric elements are skutterudites and comprise two or more of Co, Fe, Cr, Ni, Sb, Ce, Yb, and Ba.

4. The method of claim 1 wherein the air-impervious vitreous enamel is applied by positioning a gap-filling quantity of vitreous enamel powder or vitreous enamel precursor powder to all gaps, firing the vitreous enamel powder to form a flowable enamel, and continuing to fire the enamel for a time sufficient to fill all gaps with enamel and bond the enamel to the substrates and the shield; then cooling the assembly, shield and enamel to about room temperature to solidify the enamel; and wherein securing the second edge of the wall to the low temperature substrate with the polymer comprises the steps of;

applying a sufficient quantity of a flowable, low temperature-curable polymer or a thermoplastic polymer at a temperature greater than its glass transition temperature, to fill the space between the second edge of the metal shield and the low temperature-side substrate; and curing the curable polymer or cooling the thermoplastic polymer to form a continuous air-excluding barrier.

5. The method of claim 1 wherein the oxidation-resistant, metal shield is one of the group consisting of austenitic stainless steel, ferritic stainless steel, and titanium.

6. The method of claim 4 wherein the flowable, low temperature-curable polymer is one of the group consisting of silicones or epoxies.

7. The method of claim 6 in which the flowable, low temperature-curable polymer further comprises an electrically non-conductive reinforcement or filler.

8. The method of claim 4 further comprising firing the enamel-precursor powder under inert atmosphere at a temperature of about 650° C.

9. The method of claim 4, further comprising applying the low temperature-curable polymer or thermoplastic to fill the space between the lower edge of the metal shield and the surface of the low temperature substrate under inert atmosphere.

10. The method of claim 9 further comprising curing the low temperature-curable polymer or solidifying the thermoplastic under inert atmosphere.

11. The method of claim 9 wherein the inert atmosphere is maintained at a pressure of between 1 and 10 pounds per square inch.

12. The method of claim 1 wherein the method of forming the shield comprises:

preparing a strip of oxidation-resistant metal shield material having two opposed sides and two opposed ends, each with an end region;

folding the strip of oxidation-resistant metal shield material back upon itself so that the opposed ends are brought into contact, or, the opposing end regions partially overlap;

joining the ends, or partially overlapping end regions, together with a joining method adapted to enable a leak-proof joint and thereby form an article with a continuous wall bounding an opening; and sizing and shaping the continuous-walled article into thin-walled shield.

13. An enclosed thermoelectric device for use in a gaseous oxidizing environment at high temperatures, the device comprising:

a plurality of thermoelectric elements comprising an equal number of n-type and p-type semiconductors, each element having a body with at least one side and opposing faces separated by a body length, a predetermined number of the thermoelectric elements being arranged in a pattern with a periphery and with one face of each element positioned for thermal communication with a heat source and thus functioning as a high temperature side of the device and with one face of each element positioned for thermal communication with a heat sink and thus functioning as a low temperature side in operation of the device, the thermoelectric elements being separated in the pattern to avoid electrical contact between them, the periphery of the patterned thermoelectric elements being characterized by sides of the outermost thermoelectric elements of the pattern and separations between the outermost thermoelectric elements;

a plurality of electrical interconnects with an electrical interconnect connecting one face of each element to the face of an adjacent thermoelectric element in the pattern and with an electrical interconnect connecting the opposite face of each thermoelectric element with the opposite face of the same, or a different, adjacent thermoelectric element in the pattern, such that n-type and p-type semiconductors are arranged for serial, or serial/parallel, interconnection of all thermoelectric elements, each thermoelectric element face being in electrical contact with an electrical interconnect to form an electrically conductive path from a first terminal to a second terminal of the device, each interconnect having a thickness;

a low temperature-side ceramic substrate for thermal communication with the heat sink and lying against the electrical interconnects on the low temperature side of the pattern and covering the low temperature side faces of the thermoelectric elements, the low temperature-side ceramic substrate being at least coextensive with the low temperature side of the pattern of the thermoelectric elements, the ceramic substrate being impervious to an oxidizing gas;

two or more high temperature-side ceramic substrates for thermal communication with the heat source, each substrate being impervious to an oxidizing gas, the high temperature side ceramic substrates being spaced apart to accommodate thermal expansion when in thermal contact with the heat source, the high temperature side substrates lying against the electrical interconnects on the high temperature side of the pattern and covering the high temperature side faces of the thermoelectric elements, the high temperature-side substrates being at least coextensive with the high temperature side of the pattern of thermoelectric elements, each high temperature side substrate having a thickness, the spaces between the high temperature side substrates being filled with an oxidizing gas-impervious, vitreous enamel, the vitreous enamel being present in sufficient quantity to fill any gaps between the spaced-apart ceramic substrates and render the high temperature side of the device continuous and impervious to oxidizing gas; and a continuous, thin-walled, oxidation-resistant, metal shield enclosing the periphery of the pattern of the thermoelectric elements between the periphery of the high temperature side substrates and the low temperature side substrate, the metal shield having a width less than, the sum of, the body length of the elements, the thicknesses of the two opposing interconnects, and the high temperature side substrate thickness at the opposing faces, the shield terminating in first and second edges; wherein the metal shield extends from the high temperature-side substrates toward the low temperature-side substrate, the first edge of the shield being secured to the high temperature side by the vitreous enamel and the second edge being secured to the low temperature substrate with a polymer so that the thermoelectric elements are located in a sealed environment within an enclosure formed of the low temperature substrate, the high temperature substrates, the shield, the vitreous enamel and the polymer, all of which cooperate to exclude oxidizing gas from the enclosure interior.

14. The thermoelectric device of claim 13 wherein the thermoelectric elements are skutterudites and comprise two or more of Co, Fe, Cr, Ni Sb, Ce, Yb, and Ba.

15. The thermoelectric device of claim 13 wherein the shield is made from one of the group of materials consisting of austenitic stainless steel, ferritic stainless steel and titanium.

16. The thermoelectric device of claim 13 wherein the sealed environment within the enclosure comprises an inert gas.

17. The thermoelectric device of claim 16 wherein the inert gas is at a pressure of between about 1 and 10 pounds per square inch.

18. The thermoelectric device of claim 13 wherein the vitreous enamel has a composition comprising silicon, sodium, and oxygen.

19. The thermoelectric device of claim 13 wherein the shield wall has a thickness of between about 10 and 100 micrometers.

20. The thermoelectric device of claim 13 wherein the shield material and shield wall thickness cooperate to limit thermal shunting to less than 5%.

* * * * *